United States Patent
Xie et al.

(10) Patent No.: US 12,382,665 B2
(45) Date of Patent: Aug. 5, 2025

(54) INCREASED GATE LENGTH AT GIVEN FOOTPRINT FOR NANOSHEET DEVICE

(71) Applicant: International Business Machines Corporation, Armonk, NY (US)

(72) Inventors: Ruilong Xie, Niskayuna, NY (US);
Julien Frougier, Albany, NY (US);
Kangguo Cheng, Albany, NY (US);
Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 770 days.

(21) Appl. No.: 17/480,747

(22) Filed: Sep. 21, 2021

(65) Prior Publication Data
US 2023/0093025 A1  Mar. 23, 2023

(51) Int. Cl.
*H10D 30/67* (2025.01)
*H10D 62/10* (2025.01)
*H10D 64/01* (2025.01)

(52) U.S. Cl.
CPC ..... *H10D 30/6757* (2025.01); *H10D 30/6735* (2025.01); *H10D 62/118* (2025.01); *H10D 64/01* (2025.01)

(58) Field of Classification Search
CPC .......... H01L 29/78696; H01L 29/0665; H01L 29/401; H01L 29/42392; H10D 30/6757; H10D 30/6735; H10D 62/118; H10D 64/01
See application file for complete search history.

(56) References Cited

U.S. PATENT DOCUMENTS

| | | | |
|---|---|---|---|
| 7,279,742 B2 | 10/2007 | Schwerin | |
| 8,957,474 B2 | 2/2015 | Kim et al. | |
| 9,425,291 B1 | 8/2016 | Balakrishnan et al. | |
| 9,645,125 B2 | 5/2017 | Yang | |
| 9,645,135 B2 | 5/2017 | Shin et al. | |
| 10,263,073 B2 | 4/2019 | Van Dal et al. | |

(Continued)

FOREIGN PATENT DOCUMENTS

| AU | 2011258422 C1 | 3/2017 |
|---|---|---|
| AU | 2017210566 A1 | 8/2017 |
| TW | I426601 B | 2/2014 |

OTHER PUBLICATIONS

Irie, H. et al., "In-Plane Mobility Anisotropy and Universality Under Uni-axial Strains in n- and p-MOS Inversion Layers on (100), (110), and (111) Si", IEDM Technical Digest. IEEE International Electron Devices Meeting, 2004, Date of Conference: Dec. 13-15, 2004, 4 pages.

(Continued)

*Primary Examiner* — Benjamin Tzu-Hung Liu
(74) *Attorney, Agent, or Firm* — Scully, Scott, Murphy & Presser, P.C.; Samuel Waldbaum

(57) ABSTRACT

Semiconductor structures having an increased gate length are provided by providing a vertical stack of suspended semiconductor channel material nanosheets that include a middle portion located between a first end portion and a second end portion. The middle portion of each suspended semiconductor channel material nanosheet is vertically offset from (i.e., higher or lower than) the first end portion and the second end portion of each suspended semiconductor channel material nanosheet.

10 Claims, 11 Drawing Sheets

(56) References Cited

U.S. PATENT DOCUMENTS

| | | |
|---|---|---|
| 10,403,628 B2 | 9/2019 | Ramachandran et al. |
| 2007/0052040 A1 | 3/2007 | Schwerin |
| 2014/0121433 A1 | 5/2014 | Cizeron et al. |
| 2017/0365557 A1 | 12/2017 | Rogers et al. |
| 2022/0157811 A1* | 5/2022 | You ............... H10D 64/251 |
| 2022/0285533 A1* | 9/2022 | Lee ............... H01L 21/764 |

OTHER PUBLICATIONS

Fischetti, M. V., et al., "Six-band kp calculation of the hole mobility in silicon inversion layers: Dependence on surface orientation, strain, and silicon thickness", Journal of Applied Physics, Jul. 15, 2003, pp. 1079-1095, vol. 94, No. 2.

* cited by examiner

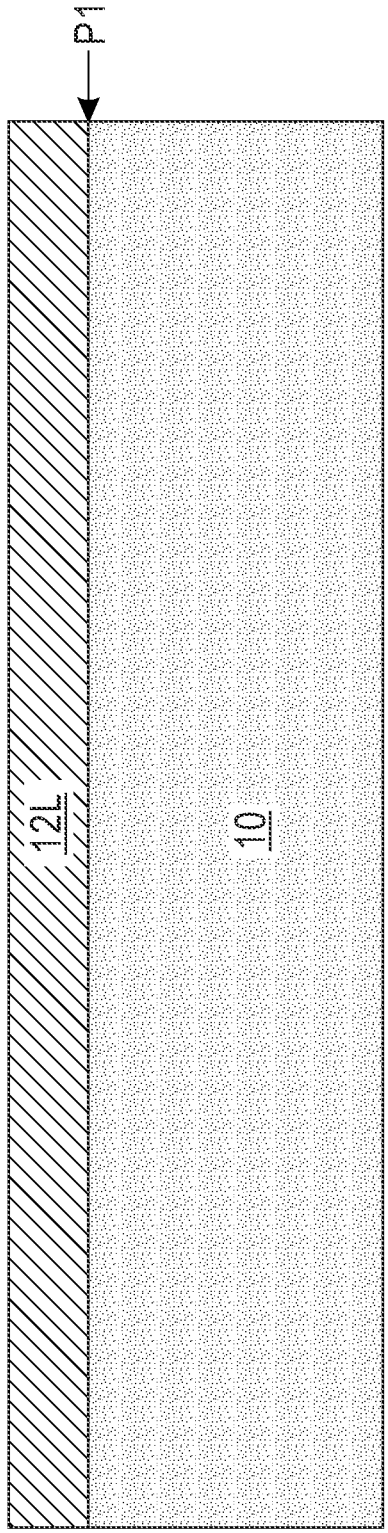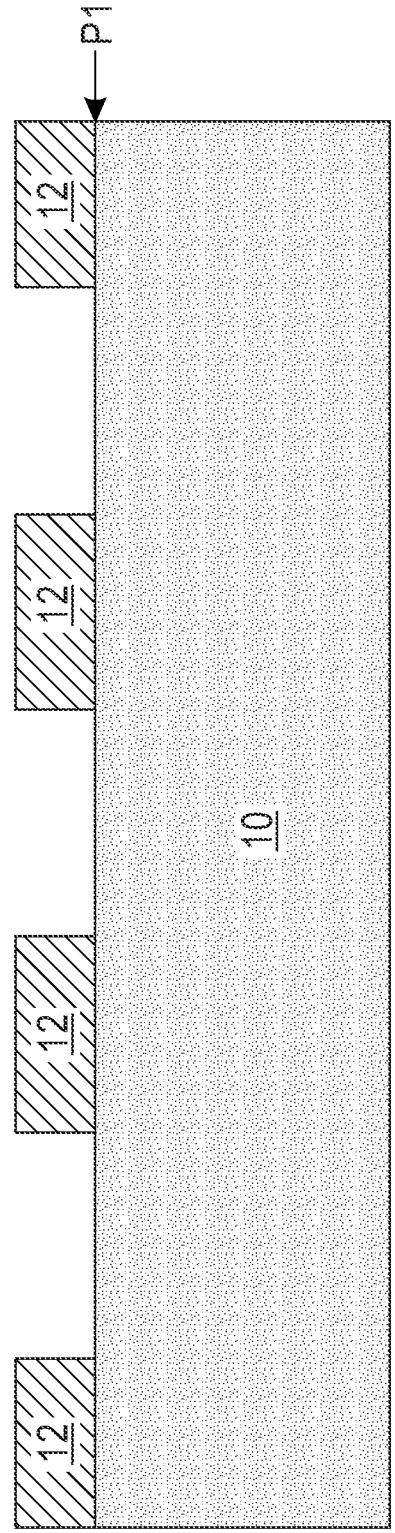

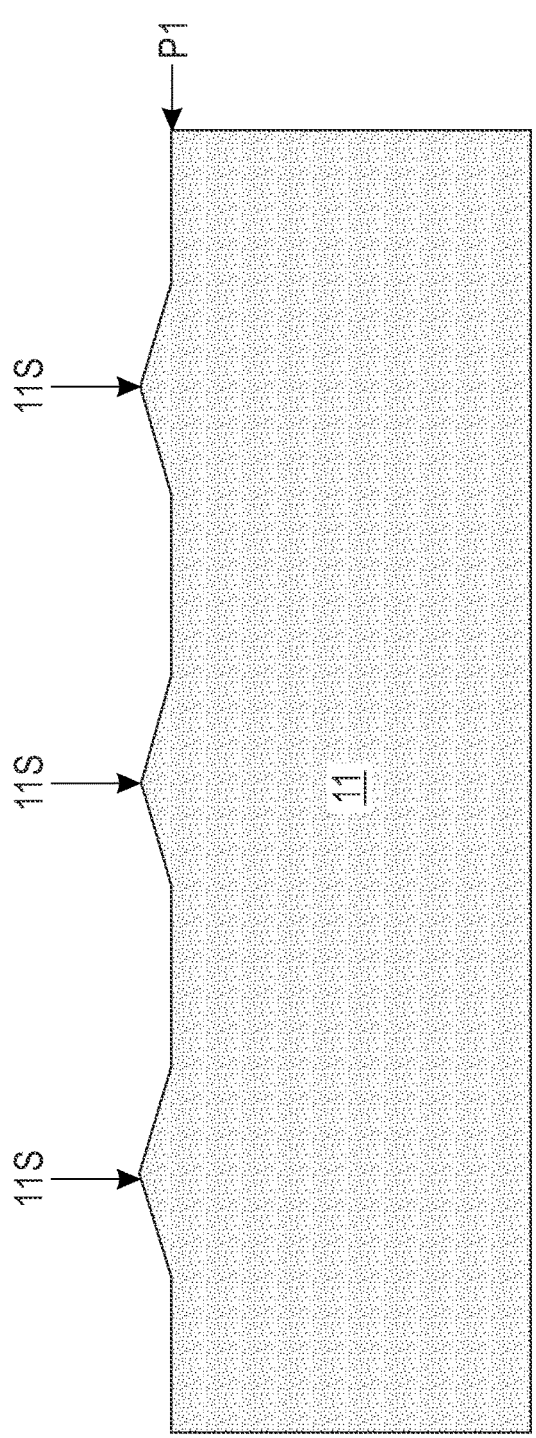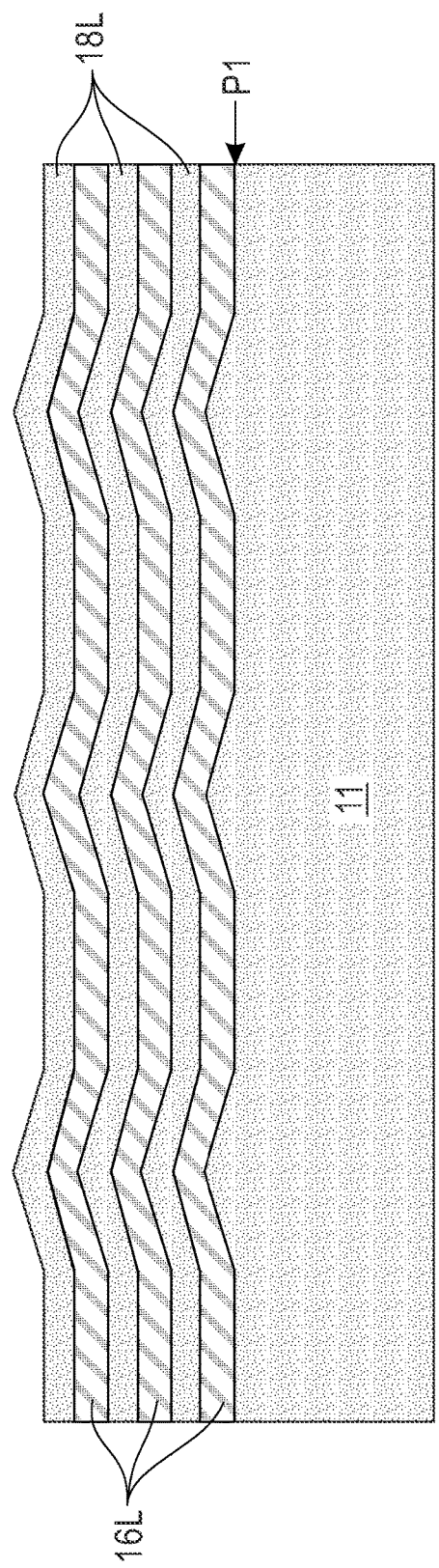

us 12,382,665 B2

INCREASED GATE LENGTH AT GIVEN FOOTPRINT FOR NANOSHEET DEVICE

BACKGROUND

The present application relates to semiconductor technology, and more particularly to a semiconductor nanosheet device having an increased gate length.

The use of non-planar semiconductor devices is the next step in the evolution of complementary metal oxide semiconductor (CMOS) devices. One type of non-planar semiconductor device that has been touted as a viable option beyond the 7 nm technology node is a nanosheet device. By "nanosheet device" it is meant that the device contains one or more layers of semiconductor channel material portions (i.e., semiconductor channel material nanosheets) having a vertical thickness that is substantially less than its width.

In conventional nanosheet devices, each semiconductor channel material nanosheet is entirely straight from one end of a semiconductor channel material nanosheet to another end of the semiconductor channel material nanosheet. In such nanosheet devices, the gate length is limited by using entirely straight semiconductor channel material nanosheets. There is thus a need for providing nanosheet devices that have increased gate length as compared to an equivalent footprint nanosheet device that contains entirely straight semiconductor channel material nanosheets.

SUMMARY

Semiconductor structures having an increased gate length are provided by providing a vertical stack of suspended semiconductor channel material nanosheets that include a middle portion located between a first end portion and a second end portion. In accordance with the present application, the middle portion of each suspended semiconductor channel material nanosheet is vertically offset from (i.e., higher or lower than) the first end portion and the second end portion of each suspended semiconductor channel material nanosheet.

In one aspect of the present application, a semiconductor structure having increased gate length is provided. In one embodiment of the present application, the semiconductor structure includes a vertical stack of suspended semiconductor channel material nanosheets, each suspended semiconductor channel material nanosheet includes a middle portion located between a first end portion and a second end portion, wherein the middle portion of each suspended semiconductor channel material nanosheet has a height that is greater than a height of both the first end portion and the second end portion of each suspended semiconductor channel material nanosheet.

In another embodiment of the present application, the semiconductor structure includes a vertical stack of suspended semiconductor channel material nanosheets, each suspended semiconductor channel material nanosheet includes a middle portion located between a first end portion and a second end portion, wherein the middle portion of each suspended semiconductor channel material nanosheet has a height that is less than a height of both the first end portion and the second end portion of each suspended semiconductor channel material nanosheet.

In another aspect of the present application, a method of forming a semiconductor structure having increased gate length is provided. In one embodiment, the method includes forming a vertical stack of suspended semiconductor channel material nanosheets located above an undulating semiconductor substrate, wherein each suspended semiconductor channel material nanosheet includes a middle portion located between a first end portion and a second end portion, wherein the middle portion of each suspended semiconductor channel material nanosheet is vertically offset from the first end portion and the second end portion of each suspended semiconductor channel material nanosheet.

BRIEF DESCRIPTION OF THE DRAWINGS

FIG. 1 is a cross sectional view of an exemplary structure that can be employed in accordance with an embodiment of the present application, the exemplary structure including a hard mask layer located on a planar surface of a semiconductor substrate.

FIG. 2 is a cross sectional view of the exemplary structure shown in FIG. 1 after patterning the hard mask layer to provide a patterned hard mask located on the planar surface of the semiconductor substrate.

FIG. 5 is a cross sectional view of the exemplary structure shown in FIG. 4 after removing the patterned hard mask from the undulating semiconductor substrate.

FIG. 6 is a cross sectional view of the exemplary structure shown in FIG. 5 after forming a nanosheet material stack of alternating layers of sacrificial semiconductor material and semiconductor channel material on the undulating semiconductor substrate, and patterning the nanosheet material stack.

DETAILED DESCRIPTION

Figure 3:
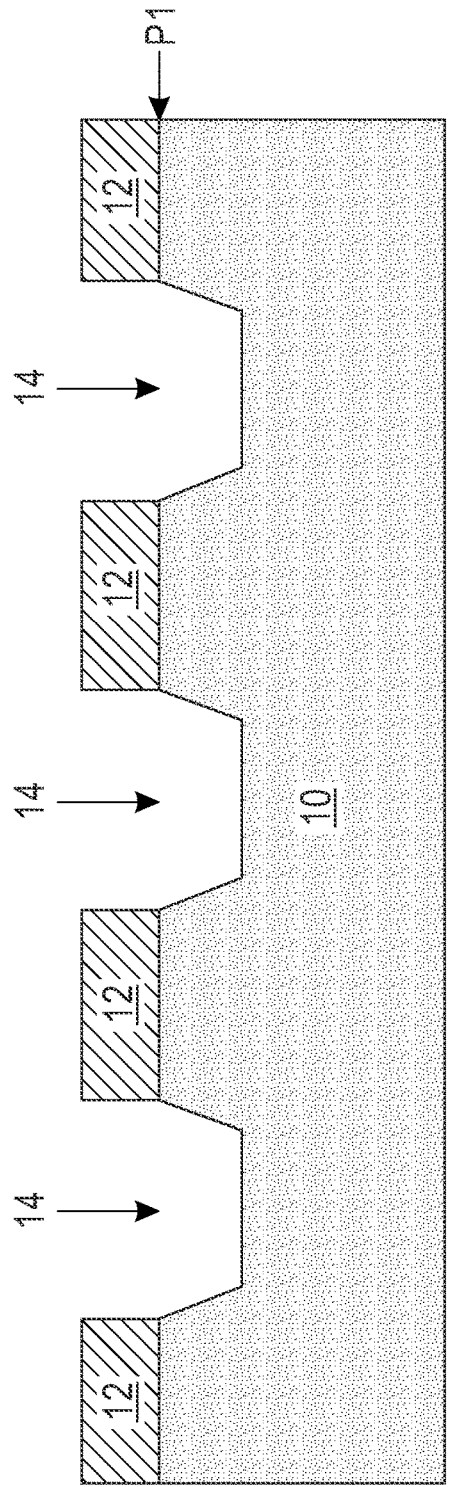
FIG. 3 is a cross sectional view of the exemplary structure shown in FIG. 2 after forming at least one trench into the semiconductor substrate utilizing the patterned hard mask as an etch mask.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in accordance with an embodiment of the present application. The exemplary structure shown in FIG. 1 includes a hard mask layer 12L located on a planar surface P1 of a semiconductor substrate 10. The planar surface P1 is a horizontal semiconductor material surface of the semiconductor substrate 10.

Semiconductor substrate 10 can be composed of one or more semiconductor materials. Examples of semiconductor materials that can be used to provide the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In some embodiments, the entirety of the semiconductor substrate 10 is composed of one or more semiconductor materials. In such an embodiment, semiconductor substrate 10 can be referred to a bulk semiconductor substrate.

Figure 4:
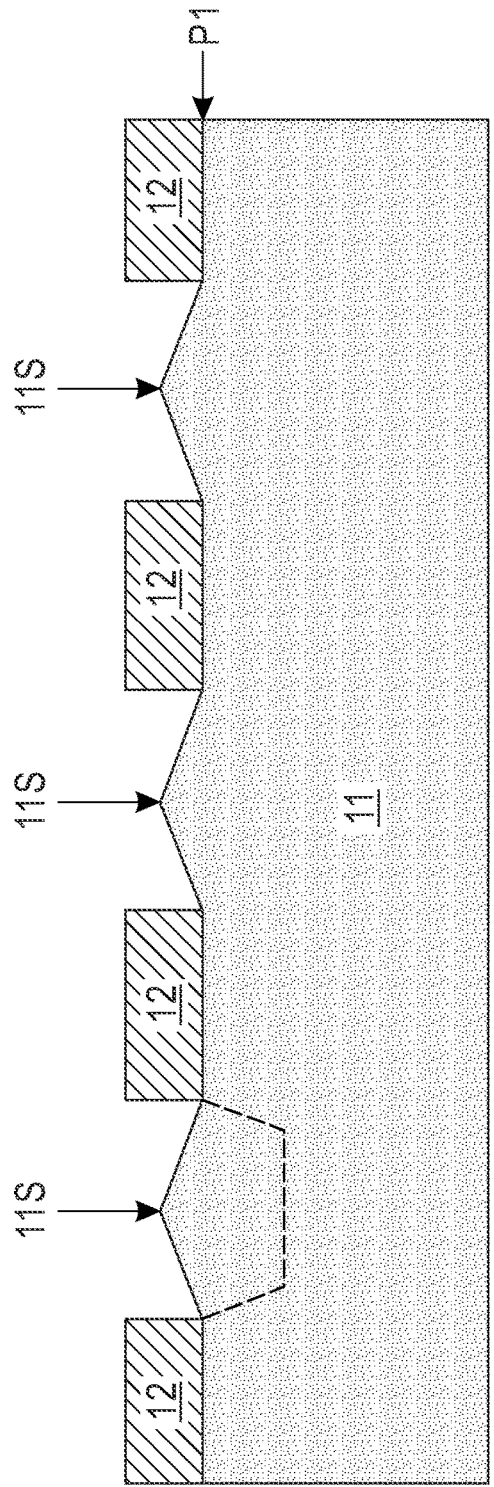
FIG. 4 is a cross sectional view of the exemplary structure shown in FIG. 3 after forming a semiconductor material in the at least one trench to provide an undulating semiconductor substrate having at least one outward bumped surface.
Figure 12:
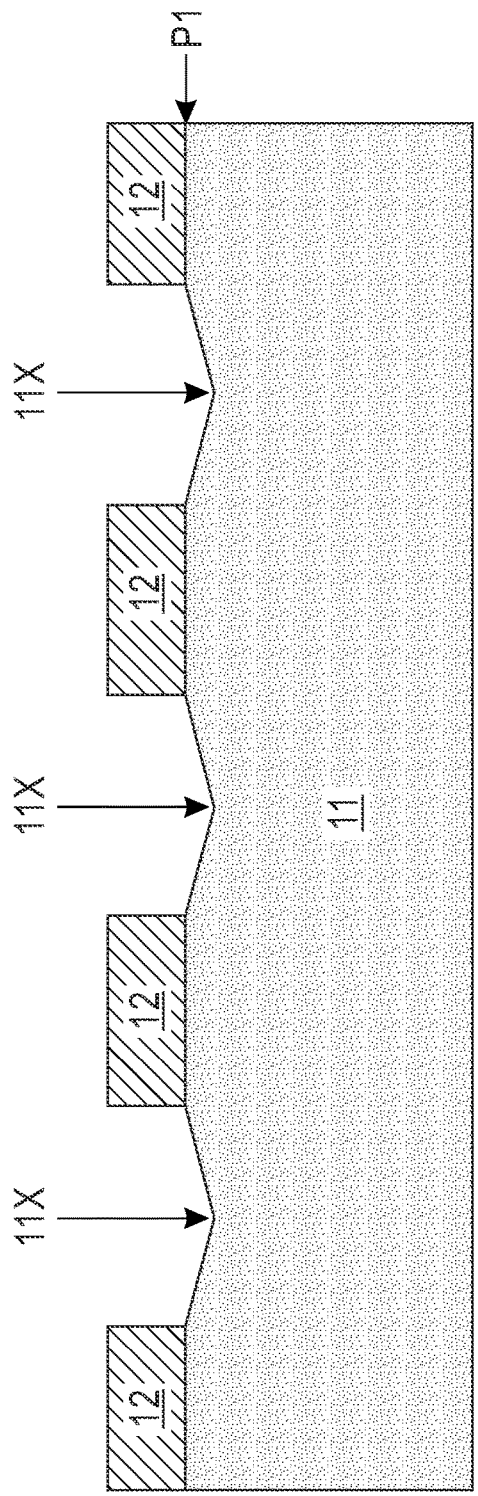
FIG. 12 is a cross sectional view of the exemplary structure shown in FIG. 2 after recessing the semiconductor substrate utilizing the patterned hard mask as an etch mask to provide an undulating semiconductor substrate having at least one inward bumped surface.

In another embodiment of the present application, semiconductor substrate 10 can be composed of a multilayered stack of from bottom to top, a bottom semiconductor material layer, an insulator material layer, and a top semiconductor material layer. Such a semiconductor substrate 10 can be referred to as a semiconductor-on-insulator (SOI) substrate. In such an embodiment, the top and bottom semiconductor material layers can be composed of one of the semiconductor materials mentioned above, and the insulator material layer can be composed of a dielectric material such as, for example, silicon oxide, and/or boron nitride. An SOI substrate can be made utilizing processing techniques well known to those skilled in the art. For example, a SOI substrate can be formed by a process referred to as a SIMOX (separation by ion implantation of oxygen) in which oxygen ions are implanted into a bulk semiconductor material and then an anneal is performed to convert the implanted oxygen region into an oxide layer. Alternatively, the SOI substrate can be formed by a bonding process in which an oxide (an/or boron nitride) layer that is formed on a semiconductor material layer is bonded to a base semiconductor material layer. In embodiments in which an SOI substrate is employed as semiconductor substrate 10, the top semiconductor material layer has planar surface P1 and the top semiconductor material layer is processed to include at least one outward bumped surface 11S as shown in FIG. 4 or at least one inward bumped surface 11X as shown in FIG. 12.

The hard mask layer 12L is composed of a hard mask material such as, for example, silicon dioxide, silicon nitride, silicon oxynitride, or any suitable combination of those dielectric materials. The hard mask layer 12L can have a thickness from 10 nm to 100 nm; although other thicknesses for the hard mask layer 12L are contemplated and can be used in the present application as the thickness of the hard mask layer 12L. In one embodiment, the hard mask layer 12L can be formed utilizing a deposition such as, for example, chemical vapor deposition (CVD), plasma enhanced chemical vapor deposition (PECVD), physical vapor deposition (PVD) or atomic layer deposition (ALD). In other embodiments, the hard mask layer 12L can be formed by a thermal process such as, for example, thermal oxidation or thermal nitridation. In yet other embodiments, a combination of a thermal process, followed by a deposition process can be used to provide the hard mask layer 12L.

Referring now to FIG. 2, there is illustrated the exemplary structure shown in FIG. 1 after patterning the hard mask layer 12L to provide a patterned hard mask 12 located on the planar surface P1 of the semiconductor substrate 10. The patterned hard mask 12 includes at least one opening which reveals a portion of the semiconductor substrate 10. Typically, a plurality of openings are formed in a periodic pattern in the hard mask layer 12. In FIG. 2 and by way of one example, the patterned hard mask 12 includes three openings that reveal three different portions of the semiconductor substrate 10.

The patterned hard mask 12 can be formed by lithography and etching. Lithography includes forming a layer of resist material on a surface of a material or material stack that needs to be patterned, exposing the layer of resist material to a desired pattern of irradiation and developing the exposed layer of resist material. The etching can include a dry etching process or chemical wet etch that is selective in removing the hard mask material stopping on the planar surface P1 of the semiconductor substrate 10. The developed layer of resist material is removed from the exemplary structure after etching the hard mask layer 12L. The removal of the developed layer of resist material includes a conventional resist removal process such as, for example, ashing.

Referring now to FIG. 3, there is illustrated the exemplary structure shown in FIG. 2 after forming at least one trench 14 into the semiconductor substrate 10 utilizing the patterned hard mask 12 as an etch mask. In the illustrated example, three trenches 14 are shown by way of one example. The at least one trench 14 is formed by performing a recess etch which removes physically exposed portions of the semiconductor substrate 10 that are not protected by the patterned hard mask 12. The recess etch can include a wet etching process or a dry etching process (such as, for example, reactive ion etching (RIE), or plasma etching).

Each trench 14 can have perfectly vertical sidewalls, or each trench 14 can have sidewalls in which some tapering occurs. In FIG. 3 and by way of one example, each trench 14 has tapered sidewalls.

Referring now to FIG. 4, there is illustrated the exemplary structure shown in FIG. 3 after forming a semiconductor material in the at least one trench 14 to provide an undulating semiconductor substrate 11 having at least one outward bumped surface 11S. The term "undulating semiconductor substrate" denotes a semiconductor substrate having a wavy surface. In this embodiment of the present application, the undulating semiconductor substrate 11 has planar surfaces P1 and outward bumped surfaces 11S. The term "outward bumped surface" denotes a surface that extends beyond a planar surface. The outward bumped surface 11S can repeat in a periodic manner.

The semiconductor material that is formed in the at least one trench 14 is typically a compositionally same semiconductor material as that of the upper portion of the semiconductor substrate 10 in which the at least one trench 14 is formed. In such an embodiment which is illustrated in FIG. 4, there is no material interfaces formed between the newly formed semiconductor material and the surface of the semiconductor substrate 10 in which the newly formed semiconductor material is formed. In other embodiments (not shown), the newly formed semiconductor material is compositionally different from the upper portion of the semiconductor substrate 10 in which the at least one trench 14 is formed. In such an embodiment, a material interface is formed between the newly formed semiconductor material and the surface of the semiconductor substrate 10 in which the newly formed semiconductor material is formed; in FIG. 4 one of the semiconductor material filled trenches includes doted lines to denote possible material interfaces that can be formed.

The semiconductor material that provides the outward bumped surfaces 11S can be formed by an epitaxial growth process. In the present application, the terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). In some embodiments, the epitaxial growth can be performed at a temperature of from 300° C. to 800° C. The epitaxial growth can be performed utilizing any well-known precursor gas or gas mixture. Carrier gases like hydrogen, nitrogen, helium and argon can be used. In some embodiments, a dopant (n-type or p-type, as defined below with respect to the source/drain regions 28) is typically added to the precursor gas or gas mixture. The semiconductor material that provides the outward bumped surfaces 11S of the undulating semiconductor substrate 11 can be a doped semiconductor material or an undoped semiconductor material.

Referring now to FIG. 5, there is illustrated the exemplary structure shown in FIG. 4 after removing the patterned hard mask 12 from the undulating semiconductor substrate 11. The patterned hard mask 12 can be removed utilizing an etching process that is selective in removing the dielectric hard mask material relative to semiconductor materials. In one example, and when the patterned hard mask 12 is composed of silicon nitride, and the undulating semiconductor substrate 11 including the planar surface P1 and outward bumped surfaces 11S are composed of silicon, a hot phosphorus wet clean can be used to remove the patterned hard mask 12 from the undulating semiconductor substrate 11.

Referring now to FIG. 6, there is illustrated the exemplary structure shown in FIG. 5 after forming a nanosheet material stack of alternating layers of sacrificial semiconductor material 16L and semiconductor channel material 18L on the undulating semiconductor substrate 11, and patterning the nanosheet material stack. It is noted that the number of nanosheet material stacks and alternating layers of sacrificial semiconductor material 16L and semiconductor channel material 18L within each nanosheet material stack can vary and is not limited to the number illustrated in the drawings of the present application. It is further noted that the nanosheet material stack including the alternating layers of sacrificial semiconductor material 16L and semiconductor channel material 18L follows the contour of the undulating semiconductor substrate 11; thus the nanosheet material stack including the alternating layers of sacrificial semiconductor material 16L and semiconductor channel material 18L will contain planar surfaces and outward bumped surfaces.

As mentioned above, the nanosheet material stack includes alternating layers of sacrificial semiconductor material 16L and semiconductor channel material 18L. Each layer of sacrificial semiconductor material 16L within the nanosheet material stack can be referred to as a "sacrificial semiconductor material layer", and each layer of semiconductor channel material 18L within the nanosheet material stack can be referred to as a "semiconductor channel material layer". As is shown in the illustrated embodiment, the nanosheet material stack includes an equal number of sacrificial semiconductor material layers 16L and semiconductor channel material layers 18L. By way of one example, the illustrated nanosheet material stack includes three layers of sacrificial semiconductor material 16L, and three layers of semiconductor channel material 18L Each layer of sacrificial semiconductor material 16L is composed of a first semiconductor material, while each layer of semiconductor channel material 18L is composed of a second semiconductor material that is compositionally different from the first semiconductor material. In some embodiments, the second semiconductor material that provides each layer of semiconductor channel material 18L is a semiconductor material that is capable of providing high channel mobility for nFET devices. In other embodiments, the second semiconductor material that provides each layer of semiconductor channel material 18L is a semiconductor material that is capable of providing high channel mobility for pFET devices.

The first semiconductor material that provides each layer of sacrificial semiconductor material 16L and the second semiconductor material that provides each layer of semiconductor channel material 18L can include one of the semiconductor materials mentioned above for semiconductor substrate 10. In the present application, the first semiconductor material that provides each layer of sacrificial semiconductor material 16L can be compositionally the same as, or compositionally different from, at least an uppermost semiconductor material portion of the semiconductor substrate 10. Typically, the first semiconductor material that provides each layer of sacrificial semiconductor material 16L is compositionally different from at least the uppermost semiconductor material portion of the semiconductor substrate 10. The second semiconductor material that provides each layer of semiconductor channel material 18L can be compositionally the same as, or compositionally different from, at least an uppermost semiconductor material portion of the semiconductor substrate 10. Typically, the second semiconductor material that provides each layer of semiconductor channel material 18L is compositionally the same as that of at least the uppermost semiconductor material portion of the semiconductor substrate 10. In one example, the semiconductor substrate 10 is composed of silicon, the first semiconductor material that provides each layer of sacrificial semiconductor material 14L is composed of a silicon germanium alloy, and the second semiconductor material that provides each layer of semiconductor channel material 16L is composed of silicon. Other combinations of semiconductor materials are possible as long as the first semiconductor material that provides each layer of sacrificial semiconductor material 16L is compositionally different from the second semiconductor material that provides each layer of semiconductor channel material 18L.

The nanosheet materials stack (including 18L and 16L) is then patterned by conventional lithography and etching such that nanosheet material stack and a top portion of the undulating semiconductor substrate 11 are removed at non-active device regions (not shown in this cross section view). Within the patterned nanosheet material stack, each layer of sacrificial semiconductor material 16L has a width that is the same as a width of each layer of semiconductor channel material 18L. As such, the sidewalls of each layer of sacrificial semiconductor material 16L are vertically aligned with the sidewalls of each layer of semiconductor channel material 18L. The thickness (i.e., height) of each layer of sacrificial semiconductor material 16L can be the same or different from the thickness of each layer of semiconductor channel material 18L. A typical thickness for each layer of sacrificial semiconductor material 16L, and each layer of semiconductor channel material 18L within the patterned material stack is from 4 nm to 20 nm. Other thicknesses are contemplated and can be used as the thickness of each layer of sacrificial semiconductor material 16L and each layer of semiconductor channel material 18L.

The nanosheet material stack can be formed by depositing alternating blanket layers of sacrificial semiconductor material and semiconductor channel material. In one example, alternating blanket layers of sacrificial semiconductor material and semiconductor channel material can be deposited utilizing epitaxial growth. After that, the nanosheet material stack is patterned by conventional lithography and etching such that the nanosheet material stack and a top portion of the undulating semiconductor substrate 11 are removed at non-active device regions (not shown in this cross section view). After nanosheet material stack patterning, a shallow trench isolation (STI) region is formed to isolate different active device regions (not shown in this cross-section view). The STI is formed by depositing dielectric materials, such as oxide, nitride, or a thin SiN layer followed by oxide overfill, followed by CMP and dielectric recess. After STI dielectric recess, the top surface of the STI is substantially co-planar with the planar surface P1 of the undulating semiconductor substrate 11.

Figure 7:
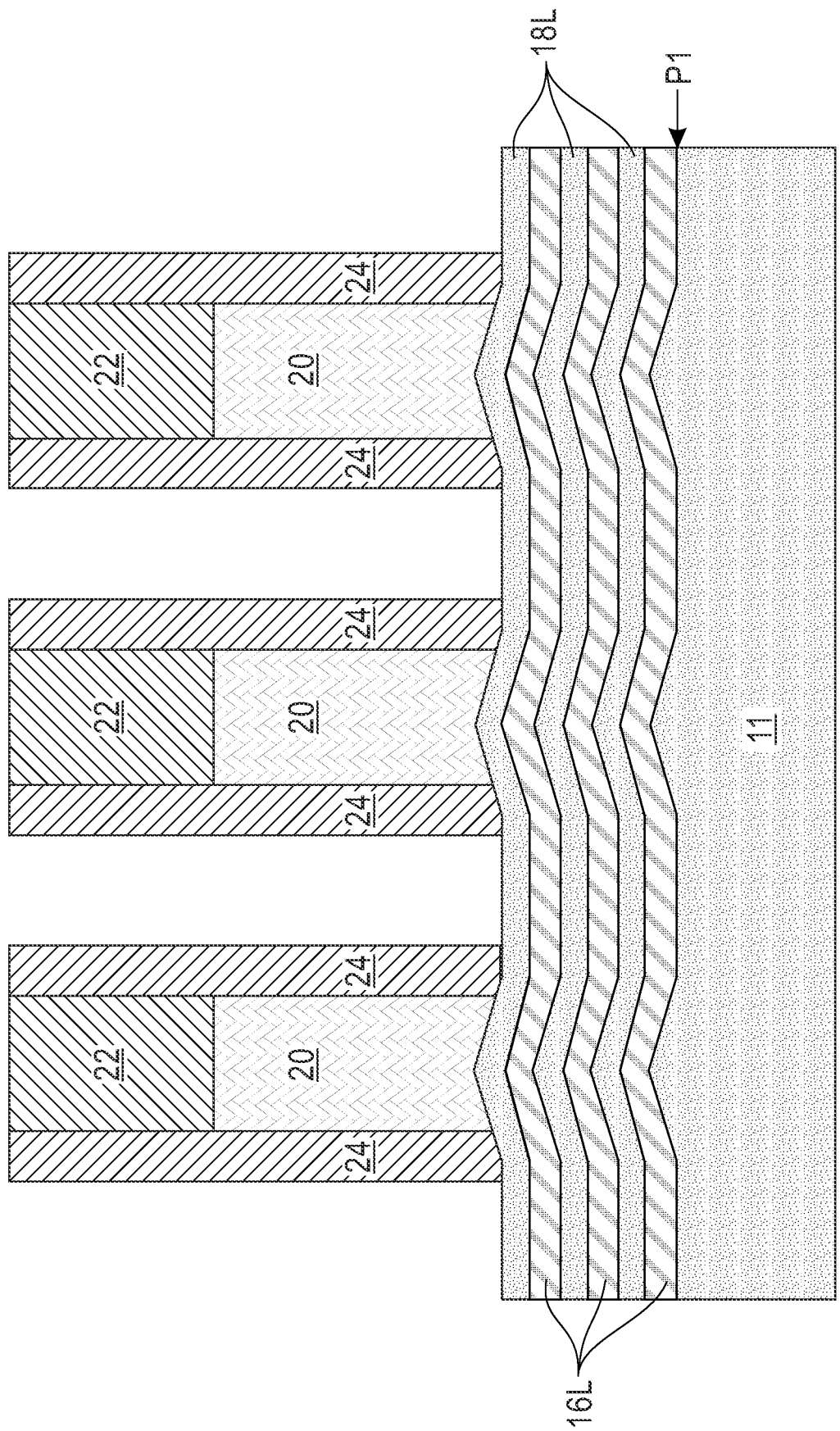
FIG. 7 is a cross sectional view of the exemplary structure shown in FIG. 6 after forming at least one sacrificial gate structure over the patterned nanosheet material stack.

Referring now to FIG. 7, there is illustrated the exemplary structure shown in FIG. 6 after forming at least one sacrificial gate structure 20/22 over the patterned nanosheet material stack. In the drawing, three sacrificial gate structure 20/22 are formed and each of these three sacrificial gate structures 20/22 are formed over the patterned nanosheet material stack. Each sacrificial gate structure 20/22 is formed above an outward bumped surface 11S of the undulating semiconductor substrate 11.

Each sacrificial gate structure includes an optional sacrificial gate dielectric material (not shown in the drawings of the present application), a sacrificial gate material 20, and a sacrificial hard mask cap 22. The sacrificial gate dielectric material can be composed of a dielectric material such as, for example, silicon dioxide. The sacrificial gate material 20 can include, but is not limited to, polysilicon, amorphous silicon, amorphous silicon germanium, tungsten, titanium, tantalum, aluminum, nickel, ruthenium, palladium, platinum, or alloys of such metals. The sacrificial hard mask cap 22 can be composed of a hard mask material such as, for example, silicon dioxide, silicon nitride, silicon oxynitride or any multilayered combination thereof. The sacrificial gate structures can be formed by depositing the various material layers that provide the sacrificial gate structures and then patterning these various deposited material layers by lithography and etching. Gate dielectric spacers 24 are then formed along a sidewall of each sacrificial gate structure by a conformal spacer liner deposition followed by an anisotropic etch to remove any horizontal portions of the spacer liner. Examples of dielectric materials for gate spacer 24 include, but are not limited to, SiN, SiBCN, SiOCN or SiOC.

Figure 8:
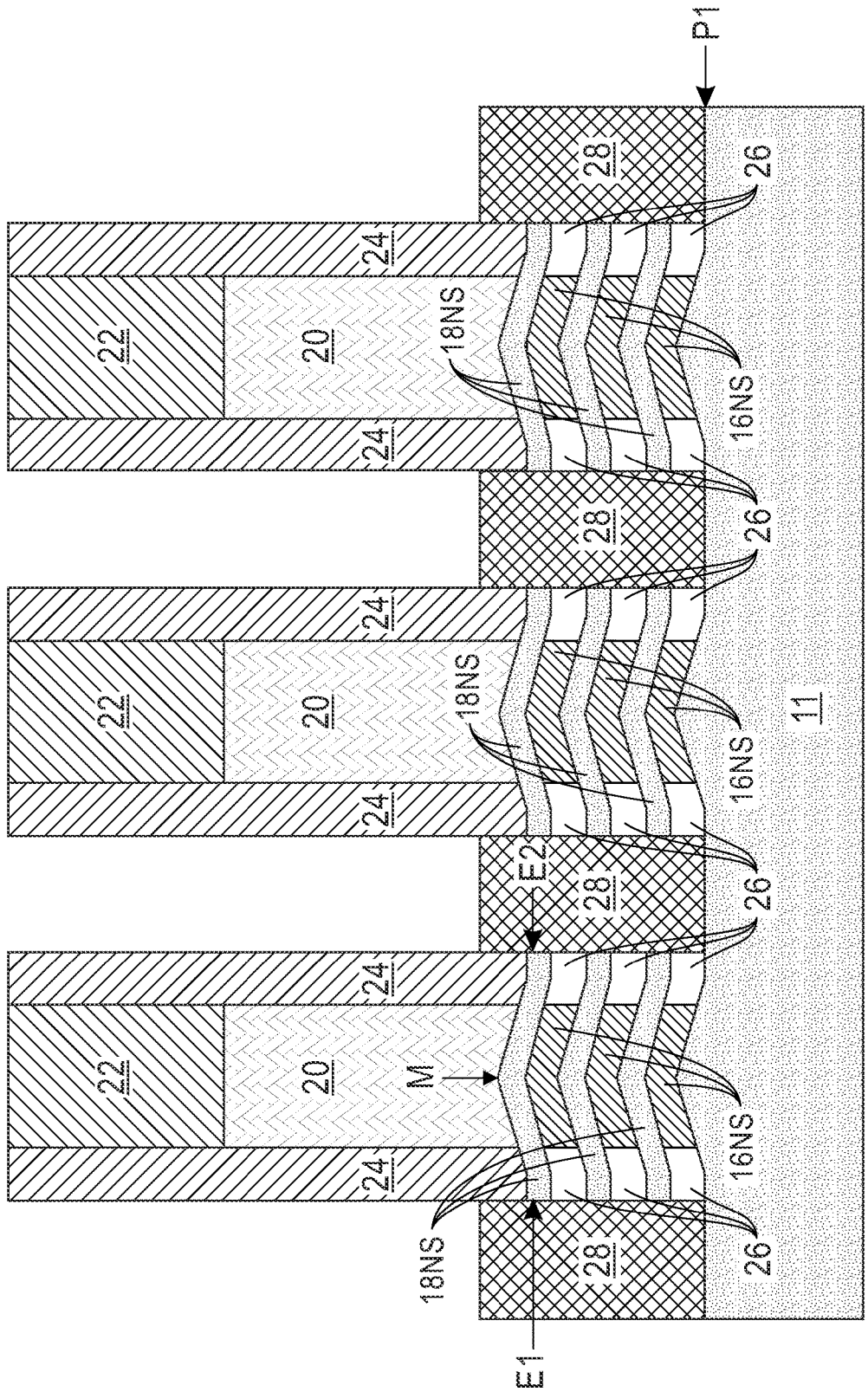
FIG. 8 is a cross sectional view of the exemplary structure shown in FIG. 7 after recessing the patterned nanosheet material stack in the source/drain region to provide a vertical nanosheet stack of alternating nanosheets of sacrificial semiconductor material and semiconductor channel material under the at least one sacrificial gate structure, laterally recessing each sacrificial semiconductor material nanosheet, forming an inner spacer at the end of each recessed sacrificial semiconductor material nanosheet of the vertical nanosheet stack and forming a source/drain region from the end of each of the semiconductor channel material nanosheets.

Referring now to FIG. 8, there is illustrated the exemplary structure shown in FIG. 7 after recessing the patterned nanosheet material stack in the source/drain region to provide a vertical nanosheet stack of alternating nanosheets of sacrificial semiconductor material 16NS and semiconductor channel material 18NS under each sacrificial gate structure, laterally recessing each sacrificial semiconductor material 16NS, forming an inner spacer at the end of each recessed sacrificial semiconductor material nanosheet 16NS of the vertical nanosheet stack and forming a source/drain region 28 from the end of each of the semiconductor channel material nanosheets 18NS.

The patterned nanosheet material stack at the source/drain region can be recessed utilizing each sacrificial gate structure 20/22 and each gate dielectric spacer 24 as an etch mask. The patterning includes an etching process which removes physically exposed portions of the patterned nanosheet material stack not protected by the etch mask, while maintaining a portion of the patterned nanosheet material stack beneath each etch mask. The maintained portion of the patterned nanosheet material stack that is located beneath each etch mask provides a vertical nanosheet stack of alternating nanosheets of sacrificial semiconductor material 16NS and semiconductor channel material 18NS. Each sacrificial semiconductor material nanosheet 16NS is composed of the first semiconductor material as mentioned above for the sacrificial semiconductor material layers 16L, and each semiconductor channel material nanosheet 18NS is composed of the second semiconductor material as mentioned above for the semiconductor channel material layers 18L. The etch stops on the undulating semiconductor substrate 11.

After defining the vertical nanosheet stack of alternating nanosheets of sacrificial semiconductor material 16NS and semiconductor channel material 18NS under the sacrificial gate structure 20/22 and gate dielectric spacer 24, end portions of the each sacrificial semiconductor material nanosheet 16NS are recessed to form a gap (not shown). The recessing includes a lateral etching process. An inner spacer 26 is then formed in the gap created by the recessing of each sacrificial semiconductor nanosheet 16NS. The forming of the inner spacers 26 includes conformal deposition of another dielectric spacer material and followed by an isotropic etching. The another dielectric spacer material can be compositionally the same as, or compositionally, different from the dielectric spacer material that provides gate dielectric spacer 24.

After inner spacer 26 formation, source/drain regions 28 are formed. As used herein, a "source/drain" region can be a source region or a drain region depending on subsequent wiring and application of voltages during operation of the FET. The source/drain regions 28 have a sidewall that is in direct physical contact with the outermost sidewalls of each nanosheet of semiconductor channel material 18NS. The source/drain regions 28 include a semiconductor material and a dopant. The semiconductor material that provides each source/drain region 28 can include Si, SiGe, SiC, or combination of those materials.

The dopant that is present in each source/drain region 28 can be a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region 28 can have a dopant concentration of from $4\times10^{20}$ atoms/cm$^3$ to $3\times10^{21}$ atoms/cm$^3$. In the present application, the source/drain regions 28 are present on a planar surface of the undulating semiconductor substrate 11.

Each source/drain region 28 can be formed by an epitaxial growth in which the dopants are present during the epitaxial growth process. The source/drain regions 28 grow laterally outward from each of the nanosheets of semiconductor channel material 18NS and exposed surface of substrate 11. A recess etch can be optionally employed so as to reduce the height of each source/drain region 28.

As illustrated in FIG. 8, each semiconductor channel material nanosheet 18NS has a middle (or center) portion, M, that is located between a first end portion, E1, and a second end portion E2. As is shown, the middle portion, M, has a height that is greater than a height of each end portion, E1 and E2. The end portions, E1 and E2 are in direct physical contact with one of the source/drain regions 28. The middle portion, M, is located directly above an outward bumped surface 11S of the undulating semiconductor substrate 11.

Figure 9:
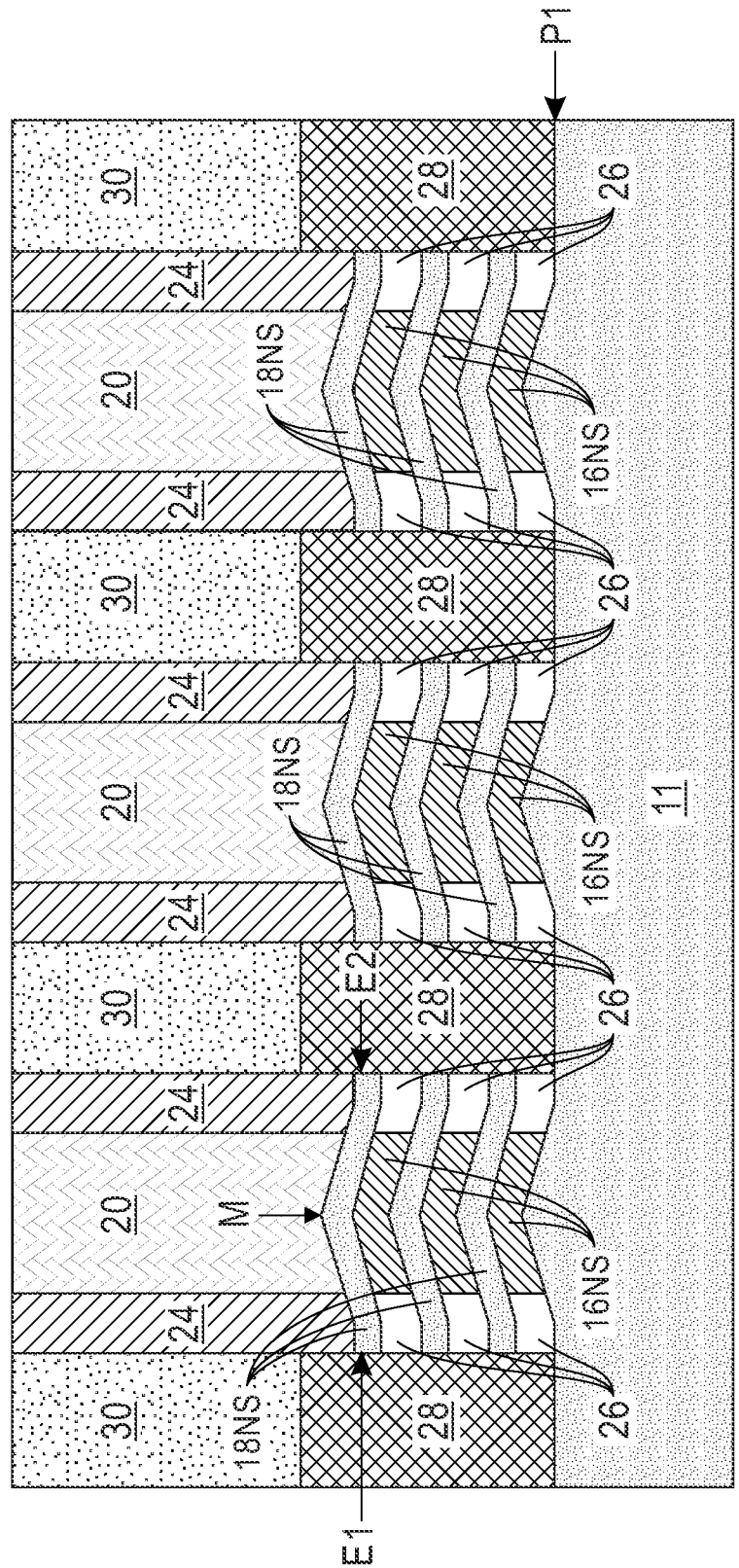
FIG. 9 is a cross sectional view of the exemplary structure shown in FIG. 8 after forming an interlayer dielectric material layer on each source/drain region.

Referring now to FIG. 9, there is illustrated the exemplary structure shown in FIG. 8 after forming an interlayer dielectric (ILD) material layer 30 on each source/drain region 28. The ILD material layer 30 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. Although not shown, the ILD material layer 30 can include a multilayered structure that includes at least two different dielectric materials stacked one atop the other such as, for example, silicon nitride and silicon dioxide. The ILD material layer 30 can be formed by a deposition process such as, for example, CVD, PECVD, or spin-on coating. A planarization process such as, for example, CMP, can be performed after the deposition of the dielectric material that provides the ILD material layer 30. The planarization process physically exposes a topmost surface of the sacrificial gate material 20 of each sacrificial gate structure 20/22. Thus, the planarization process removes each sacrificial hard mask cap 22 as well as an upper portion of each gate dielectric spacer 24. As is shown in FIG. 9, the ILD material layer 30 has a topmost surface that is coplanar with a topmost surface of each sacrificial gate material 20 as well as a topmost surface of the remaining portion of each gate dielectric spacer 24.

Figure 10:
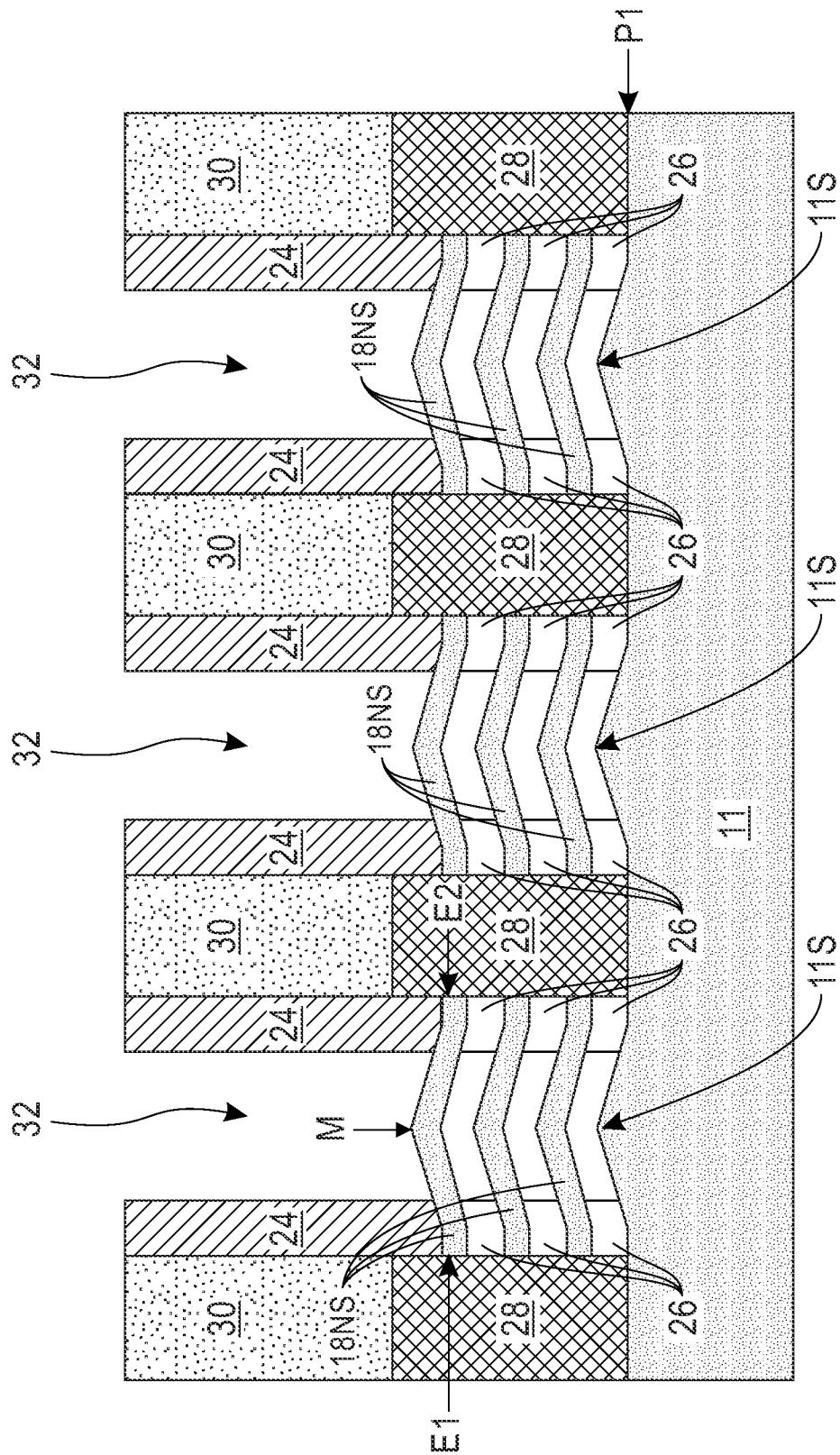
FIG. 10 is a cross sectional view of the exemplary structure shown in FIG. 9 after removing the at least one sacrificial gate structure to reveal the vertical nanosheet stack and removing each recessed sacrificial semiconductor material nanosheet to provide a gate cavity above and below each suspended semiconductor channel material nanosheet.

Referring now to FIG. 10, there is illustrated the exemplary structure shown in FIG. 9 after removing the at least one sacrificial gate structure (since the sacrificial hard mask cap 22 was previously removed, the sacrificial gate material 20 and, if present, the sacrificial gate dielectric material are removed during this step of the present application) to reveal the vertical nanosheet stack and removing each recessed sacrificial semiconductor material nanosheet 16NS to provide a gate cavity 32 above and below each suspended semiconductor channel material nanosheet 18NS.

Each sacrificial gate structure (i.e., the sacrificial gate material 20 and, if present, the sacrificial gate dielectric material) is removed to provide access to the sacrificial semiconductor material nanosheets 16NS. The sacrificial semiconductor material nanosheets 16NS are then removed to provide a gate cavity 32 above and below the now suspended semiconductor channel material nanosheets 18NS of the vertical nanosheet stack. The removal of the sacrificial gate material 20 and, if present, the sacrificial gate dielectric material of each sacrificial gate structure can include one or more etching processes. In one example, one or more wet etching processes, such as hot ammonia wet clean, can be used to remove the sacrificial gate material 20 and, if present, the sacrificial gate dielectric material of each sacrificial gate structure can be removed by DHF wet clean. The removal of each the sacrificial semiconductor material nanosheet 16NS can include an etching process that is selective in removing the sacrificial semiconductor material relative to the semiconductor channel material, such as vapor phased HCl dry etch Referring now to FIG. 11, there is illustrated the exemplary structure shown in FIG. 10 after forming a functional gate structure 34 in the gate cavity 32. The functional gate structure 34 includes at least a gate dielectric material layer and a gate electrode; both of which are not individually shown in the drawings of the present application. The functional gate structure 34 wraps arounds each suspended semiconductor channel material nanosheet 18NS. As is known, the gate dielectric material layer of the functional gate structure 34 is in direct contact with physically exposed portions of each semiconductor channel material nanosheet 16, and the gate electrode is located on the gate dielectric material layer. In some embodiments, the functional gate structure 34 includes a work function metal (WFM) layer located between the gate dielectric material layer and the gate electrode. In some embodiments (not shown), a gate cap is located above a recessed functional gate structure 34. In other embodiments, a gate cap is omitted.

The functional gate structure 34 includes forming a continuous layer of gate dielectric material and a gate electrode material inside and outside the gate cavity 32. The continuous layer of gate dielectric material can include silicon oxide, or a dielectric material having a dielectric constant greater than silicon oxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The high-k gate dielectric material can further include dopants such as lanthanum (La), aluminum (Al) and/or magnesium (Mg).

The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm. The continuous layer of gate dielectric material does not fill in the entirety of the gate cavity 32.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide (TaCx), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, CMP, is used to remove the continuous layer of the gate dielectric material, the optional layer of WFM and the gate electrode material from outside each gate cavity 32.

The remaining continuous layer of the gate dielectric material that is present inside the gate cavity 32 can be referred to as a gate dielectric material layer, the remaining optional layer of WFM that is present inside the gate cavity can be referred to a WFM layer, and remaining gate electrode material that is present inside the gate cavity 32 provides a gate electrode.

When present, gate cap can be composed of a hard mask material such as, for example, silicon dioxide or silicon nitride. The gate cap can be formed by recessing the gate electrode, depositing a hard mask material and, planarizing the deposited hard mask material.

Figure 11:
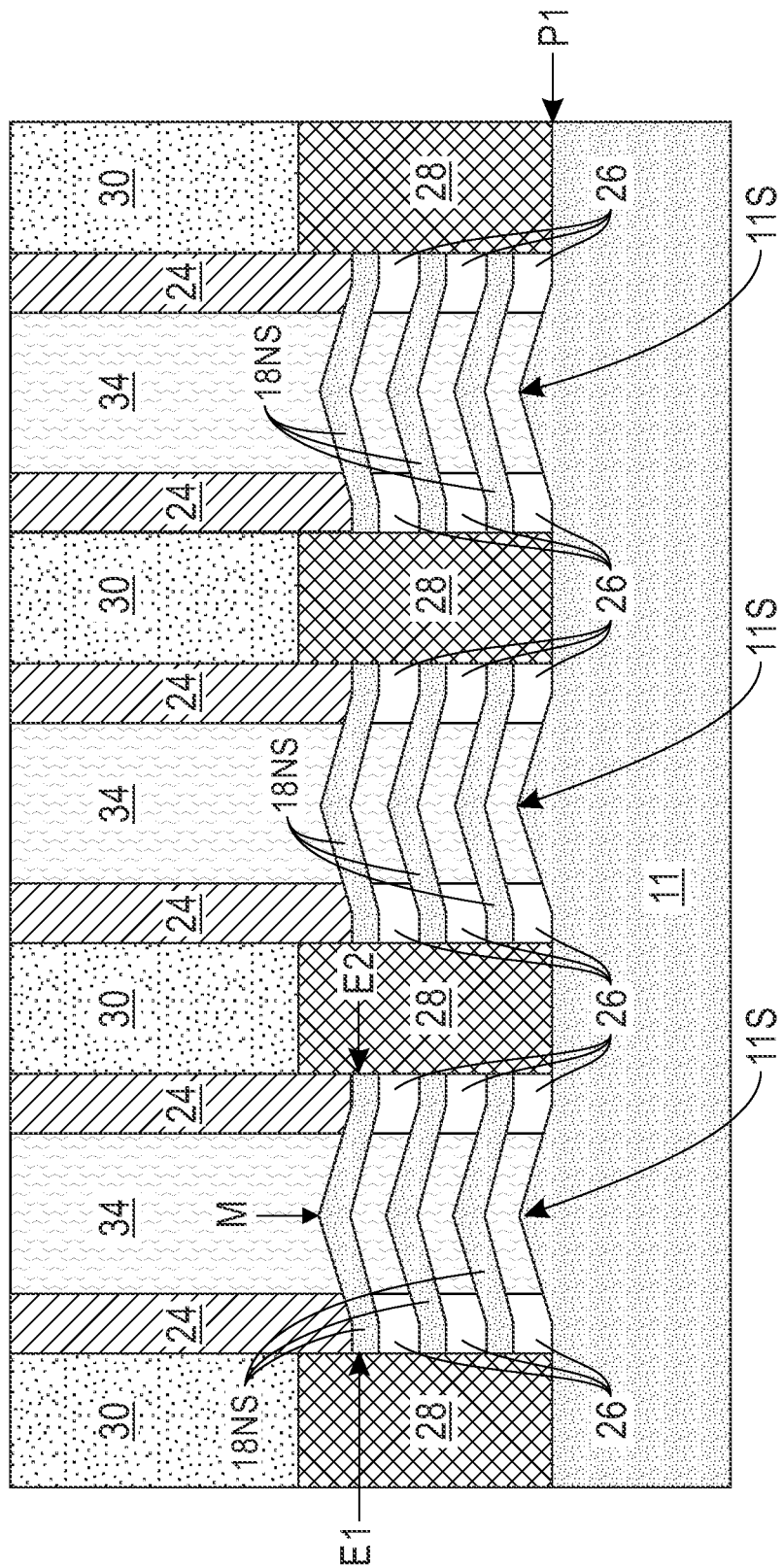
FIG. 11 is a cross sectional view of the exemplary structure shown in FIG. 10 after forming a functional gate structure in the gate cavity.

As illustrated in FIG. 11, each suspended semiconductor channel material nanosheet 18NS has the middle (or center) portion, M, that is located between the first end portion, E1, and the second end portion E2. As is shown, the middle portion, M, has a height that is greater than a height of each end portion, E1 and E2. The end portions, E1 and E2 are in direct physical contact with one of the source/drain regions 28. The middle portion, M, is located directly above an outward bumped surface 11S of the undulating semiconductor substrate 11. Due to the non-planar nature of each suspended semiconductor channel material nanosheet 18NS (as compared to the planar surface P1 of the undulating semiconductor substrate 11) the gate length of the functional gate structure 34 is increased.

As is further shown in FIG. 11, the functional gate structure 34 wraps around at least the middle portion, M, of each suspended semiconductor channel material nanosheet 18NS. Also, a dielectric spacer (i.e., gate dielectric spacer 24 and inner spacer 26) are located above and below the first end portion E1 and the second end portion E2 of each suspended semiconductor channel material nanosheet 18NS, wherein the dielectric spacer laterally surrounds the functional gate structure 34. It is noted that the middle portion, M, of each suspended semiconductor channel material nanosheet 18NS is not parallel to the planar surface P1 of the underlying undulating semiconductor substrate 11. In this embodiment, the outward bump surface 11S of the undulating semiconductor substrate 11 is vertically aligned beneath the middle portion, M, of each suspended semiconductor channel material nanosheet 18NS.

Referring now to FIG. 12, there is illustrated the exemplary structure shown in FIG. 2 after recessing the semiconductor substrate 10 utilizing the patterned hard mask 12 as an etch mask to provide an undulating semiconductor substrate 11 having at least one inward bumped surface 11X. In this embodiment of the present application, the undulating semiconductor substrate 11 has planar surfaces P1 and inward bumped surfaces 11X. The term "inward bumped surface" denotes a surface that extends below a planar surface and into the undulating semiconductor substrate 11; the inward bumped surface 11X can be referred to as an indentation in the undulating semiconductor substrate 11. The inward outward bumped surface 11X can repeat in a periodic manner. This recessing step includes an etching process such as for example, a wet etching process or a dry etching process (such as, for example, reactive ion etching (RIE), or plasma etching).

Figure 13:
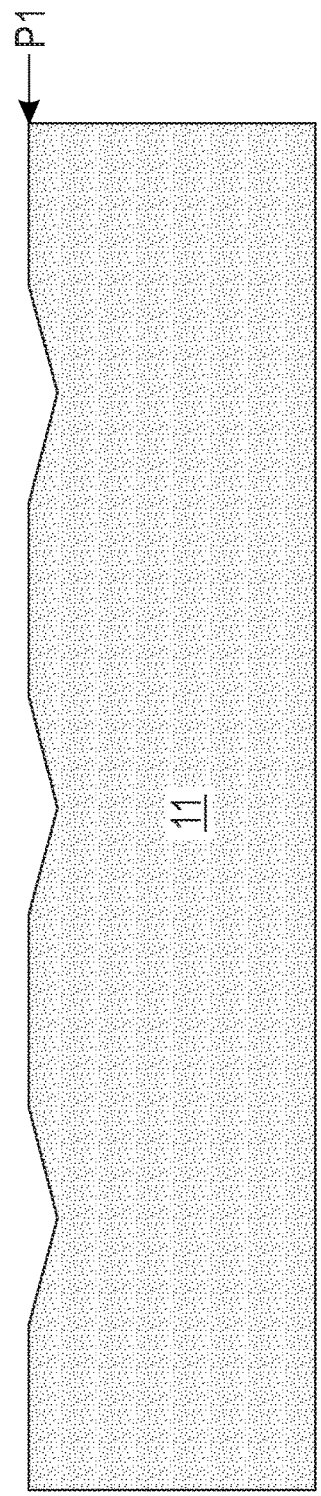
FIG. 13 is a cross sectional view of the exemplary structure shown in FIG. 12 after removing the patterned hard mask.

Referring now to FIG. 13, there is illustrated the exemplary structure shown in FIG. 12 after removing the patterned hard mask 12. The patterned hard mask 12 can be removed utilizing the material removal process mentioned above in removing the patterned hard mask 12 from the exemplary structure shown in FIG. 4 of the present application.

Figure 14:
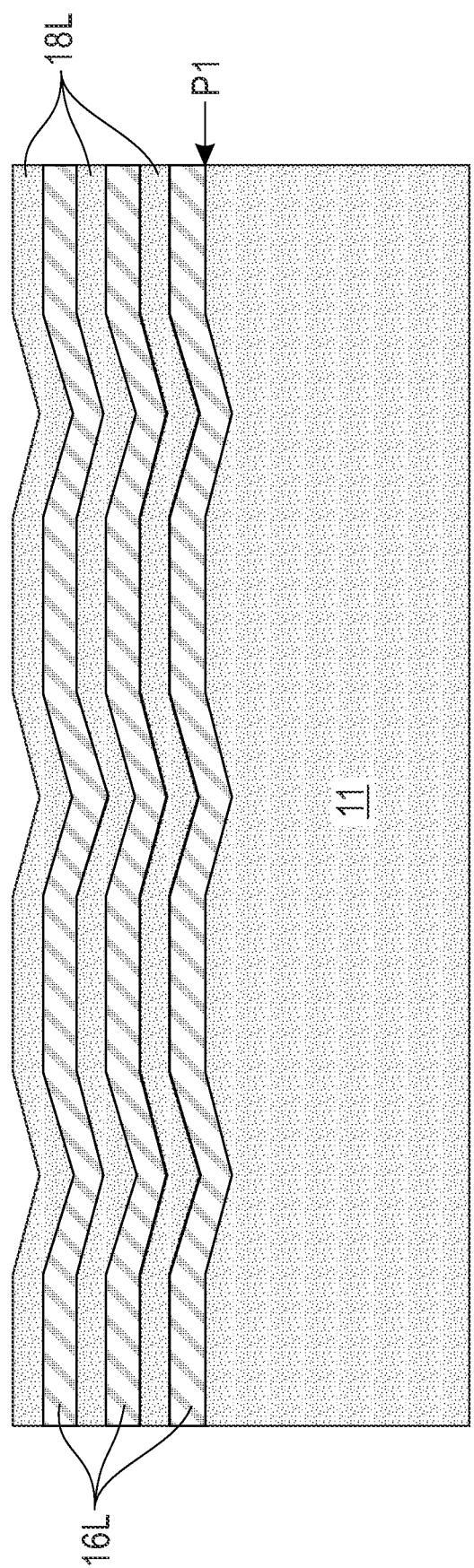
FIG. 14 is a cross sectional view of the exemplary structure shown in FIG. 13 after forming a patterned nano sheet material stack of alternating layers of sacrificial semiconductor material and semiconductor channel material on the undulating semiconductor substrate.

Referring now to FIG. 14, there is illustrated the exemplary structure shown in FIG. 13 after forming a patterned nanosheet material stack of alternating layers of sacrificial semiconductor material 16L and semiconductor channel material 18L on the undulating semiconductor substrate 11. The patterned nanosheet material stack of this embodiment of the present application is the same as the patterned nanosheet material stack of the previous embodiment. See, the above description of the patterned nanosheet material stack that is provided in FIG. 6 which can be used herein for the patterned nanosheet material stack 16L/18L shown in FIG. 14.

Figure 15:
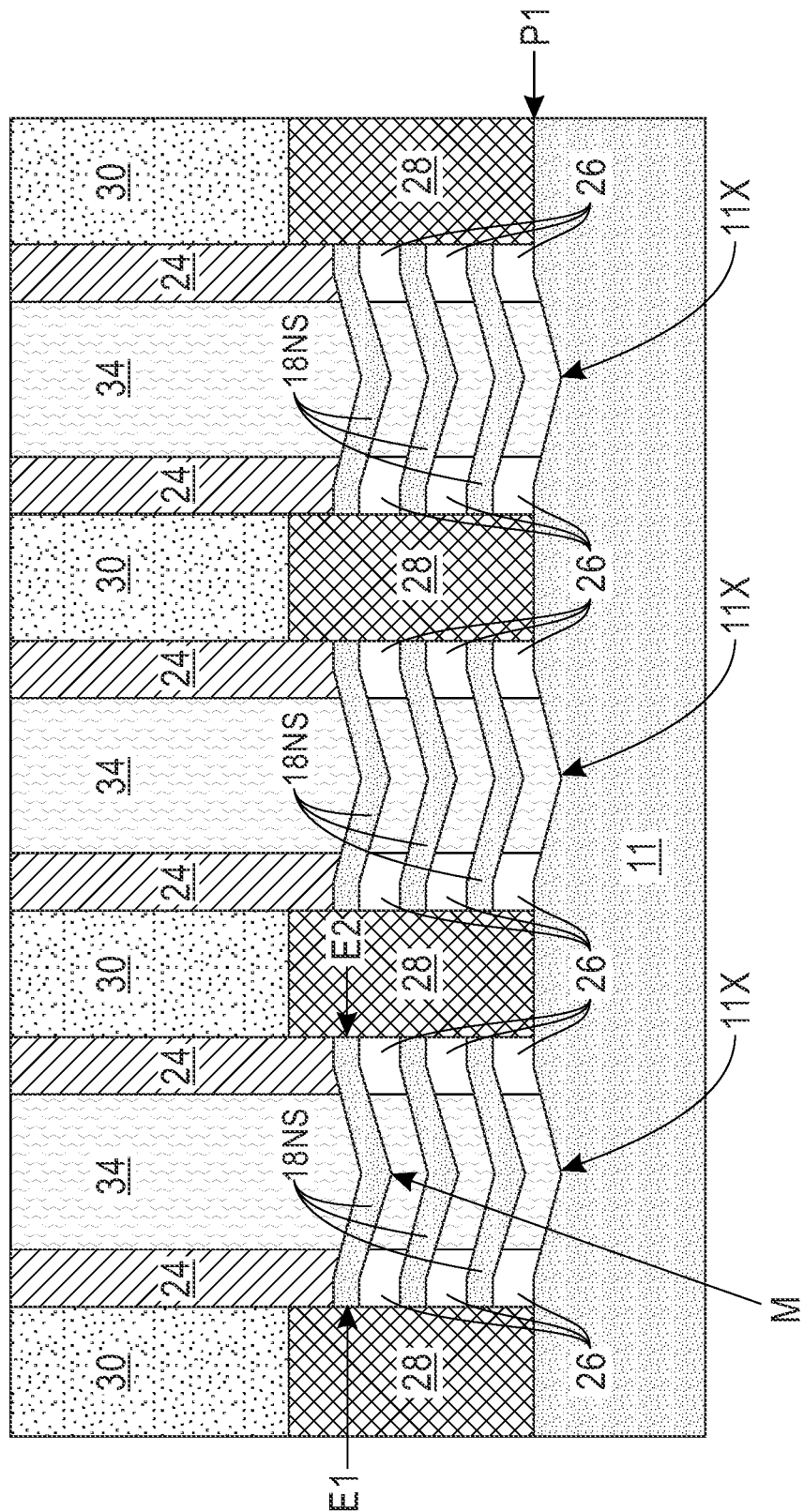
FIG. 15 is a cross sectional view of the exemplary structure shown in FIG. 14 after further device processing.

Referring now to FIG. 15, there is illustrated the exemplary structure shown in FIG. 14 after further device processing. The further device processing includes the steps described above for forming the structures shown in FIGS. 7-11 of the present application. That is, the further device processing includes forming at least one sacrificial gate structure on the patterned nanosheet stack 16L/18L with at least one inward bumped surface 11X of the undulating semiconductor substrate 11 (See, the description above related to forming the exemplary structure shown in FIG. 7), recessing the patterned nanosheet stack 16L/18L in the source/drain region to provide the vertical nanosheet stack under the sacrificial gate structure, laterally recessing each sacrificial semiconductor nanosheet, forming an inner spacer 26 at the end of each recessed sacrificial semiconductor material nanosheet (not shown) of the vertical nanosheet stack and forming a source/drain region 28 from the end of each of the semiconductor channel material nanosheets 18NS (See the description above related to forming the exemplary structure shown in FIG. 8), forming an interlayer dielectric material layer 30 on each source/drain region 28 (See the description above related to forming the exemplary structure shown in FIG. 9), removing the at least one sacrificial gate structure to reveal the vertical nanosheet stack and removing each recessed sacrificial semiconductor material nanosheet to provide a gate cavity above and below each suspended semiconductor channel material nanosheet 16NS (See the description above related to forming the exemplary structure shown in FIG. 10), and after forming a functional gate structure 34 in the gate cavity (See the description above related to forming the exemplary structure shown in FIG. 11).

As illustrated in FIG. 15, each suspended semiconductor channel material nanosheet 18NS has the middle (or center) portion, M, that is located between the first end portion, E1, and the second end portion E2. As is shown, the middle portion, M, has a height that is less than a height of each end portion, E1 and E2. The end portions, E1 and E2 are in direct physical contact with one of the source/drain regions 28. The middle portion, M, is located directly above an inward bumped surface 11X of the undulating semiconductor substrate 11. Due to the non-planar nature of each suspended semiconductor channel material nanosheet 18NS (as compared to the planar surface P1 of the undulating semiconductor substrate 11) the gate length of the functional gate structure 34 is increased. In this embodiment, the inward bumped surface 11X of the undulating semiconductor substrate 11 is vertically aligned beneath the middle portion, M, of each suspended semiconductor channel material nanosheet 18NS.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a vertical stack of semiconductor channel material nanosheets, each semiconductor channel material nanosheet comprising a middle portion located between a first end portion and a second end portion, wherein the middle portion of each semiconductor channel material nanosheet has a height that is less than a height of both the first end portion and the second end portion of each semiconductor channel material nanosheet, and wherein the first end portion of each semiconductor channel material nanosheet has an outermost surface that is vertically aligned to each other, and the second end portion of each semiconductor channel material nanosheet has an outermost surface that is vertically aligned to each other;
a source/drain region extending outward from both the first end portion and the second end portion of each semiconductor channel material nanosheet; and
an undulating semiconductor substrate located beneath the vertical stack of semiconductor channel material nanosheets, wherein the undulating semiconductor substrate comprises a planar surface and an inward bumped surface, the inward bumped surface of the undulating semiconductor substrate is vertically aligned beneath the middle portion of each semiconductor channel material nanosheet and the planar surface is located directly beneath the source/drain region.

2. The semiconductor structure of claim 1, further comprising a functional gate structure wrapping around at least the middle portion of each semiconductor channel material nanosheet.

3. The semiconductor structure of claim 2, further comprising a dielectric spacer located above and below the first end portion and the second end portion of each semiconductor channel material nanosheet, wherein the dielectric spacer laterally surrounds the functional gate structure.

4. The semiconductor structure of claim 1, further comprising an interlayer dielectric material layer located above each source/drain region.

5. The semiconductor structure of claim 1, wherein the middle portion of each semiconductor channel material nanosheet is not parallel to the planar surface of the underlying undulating semiconductor substrate.

6. A method of forming a semiconductor structure, the method comprising:
   forming a vertical stack of semiconductor channel material nanosheets located above an undulating semiconductor substrate, wherein each semiconductor channel material nanosheet comprises a middle portion located between a first end portion and a second end portion, wherein the middle portion of each semiconductor channel material nanosheet is vertically offset from the first end portion and the second end portion of each semiconductor channel material nanosheet, and wherein the first end portion of each semiconductor channel material nanosheet has an outermost surface that is vertically aligned to each other, and the second end portion of each semiconductor channel material nanosheet has an outermost surface that is vertically aligned to each other; and
   forming a source/drain region extending outward from both the first end portion and the second end portion of each semiconductor channel material nanosheet, wherein the undulating semiconductor substrate comprises a planar surface and a bumped surface, the bumped surface of the undulating semiconductor substrate is vertically aligned beneath the middle portion of each semiconductor channel material nanosheet and the planar surface is located directly beneath the source/drain region.

7. The method of claim 6, wherein the middle portion is higher than the first end portion and the second end portion of each semiconductor channel material nanosheet, and the bumped surface of the undulating semiconductor substrate is an outward bumped surface.

8. The method of claim 6, wherein the middle portion is lower than the first end portion and the second end portion of each semiconductor channel material nanosheet, and wherein the bumped surface of the undulating semiconductor substrate is an inward bumped surface.

9. The method of claim 6, further comprising forming a functional gate structure wrapping around at least the middle portion of each semiconductor channel material nanosheet.

10. A semiconductor structure comprising:
   a vertical stack of semiconductor channel material nanosheets, each semiconductor channel material nanosheet comprising a middle portion located between a first end portion and a second end portion, wherein the middle portion of each semiconductor channel material nanosheet has a height that is vertically offset from a height of both the first end portion and the second end portion of each semiconductor channel material nanosheet, and wherein the first end portion of each semiconductor channel material nanosheet has an outermost surface that is vertically aligned to each other, and the second end portion of each semiconductor channel material nanosheet has an outermost surface that is vertically aligned to each other; and
   a source/drain region extending outward from both the first end portion and the second end portion of each semiconductor channel material nanosheet, wherein the undulating semiconductor substrate comprises a planar surface and a bumped surface, the bumped surface of the undulating semiconductor substrate is vertically aligned beneath the middle portion of each semiconductor channel material nanosheet and the planar surface is located directly beneath the source/drain region.

* * * * *